US006744180B2

(12) United States Patent
Nakamura et al.

(10) Patent No.: US 6,744,180 B2
(45) Date of Patent: Jun. 1, 2004

(54) PIEZOELECTRIC ELECTROACOUSTIC TRANSDUCER

(75) Inventors: Yoshitaka Nakamura, Toyama (JP); Kiyotaka Tajima, Toyama (JP); Tetsuo Takeshima, Toyama (JP); Yuko Yokoi, Toyama-ken (JP); Tadashi Okuzawa, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 6 days.

(21) Appl. No.: 10/270,696

(22) Filed: Oct. 16, 2002

(65) Prior Publication Data

US 2003/0107300 A1 Jun. 12, 2003

(30) Foreign Application Priority Data

Oct. 19, 2001 (JP) ....................................... 2001-321834

(51) Int. Cl.[7] ............................................ H01L 41/053

(52) U.S. Cl. ....................... 310/348; 310/324; 310/330; 310/365

(58) Field of Search ................................ 310/324, 330, 310/331, 348, 365

(56) References Cited

U.S. PATENT DOCUMENTS 4,992,693 A * 2/1991 Kishi et al. ................. 310/348
5,430,345 A * 7/1995 Takahashi ................... 310/348
6,420,818 B1 * 7/2002 Kishimoto et al. ......... 310/324
6,472,798 B2 * 10/2002 Kishimoto .................. 310/344
6,570,299 B2 * 5/2003 Takeshima et al. ......... 310/348

FOREIGN PATENT DOCUMENTS

JP 2000-310990 11/2000 .......... G10K/9/122
JP 2001-095094 4/2001 ........... H04R/17/00

* cited by examiner

*Primary Examiner*—Thomas M. Dougherty
(74) *Attorney, Agent, or Firm*—Keating & Bennett, LLP

(57) ABSTRACT

A piezoelectric electroacoustic transducer includes two electrodes, a substantially square piezoelectric diaphragm producing a bending vibration in the thickness direction thereof in response to application of an alternating voltage between the two electrodes, a housing for housing the piezoelectric diaphragm, an elastic sealant for sealing the gap between the periphery of the diaphragm and the inner side surface of the housing, supports, disposed in the housing, for supporting at least two mutually opposing sides of the piezoelectric diaphragm or the four corners of the piezoelectric diaphragm, grooves which are disposed in the housing so as to face the periphery of the rear surface of the piezoelectric diaphragm and in which the elastic sealant is filled, and walls defining inner portions of the grooves, arranged such that the upper surfaces of the walls are located below those of the supports, for preventing the elastic sealant from flowing out to the bottom of the housing.

17 Claims, 7 Drawing Sheets

PIEZOELECTRIC ELECTROACOUSTIC TRANSDUCER

BACKGROUND OF THE INVENTION

1. Field of the Invention

The present invention relates to piezoelectric electroacoustic transducers such as a piezoelectric receiver and a piezoelectric sounder.

2. Description of the Related Art

Piezoelectric electroacoustic transducers, for use as either a piezoelectric sounder or a piezoelectric receiver for generating a warning or an operating sound, have been widely used in electronic apparatuses, electric appliances, mobile phones, and other devices. Such a piezoelectric electroacoustic transducer is generally constructed such that a unimorph piezoelectric diaphragm is formed by bonding a round piezoelectric element to one side of a round metal plate. The periphery of the rear surface of the metal plate is supported by a silicone rubber in a round case, and the opening of the case is closed by a cover.

However, the round diaphragm has problems in that its production efficiency and electroacoustic transducing efficiency are both low and also it is difficult to reduce its size.

In view of the problems described above, a surface-mounted piezoelectric electroacoustic transducer using a square diaphragm in place of the round diaphragm is disclosed in Japanese Patent Application Publication No. 2000-310990 so as to improve both production efficiency and electroacoustic transducing efficiency and to reduce its size. The piezoelectric electroacoustic transducer has the square piezoelectric diaphragm, an insulating case, supports for supporting the diaphragm, and a cover plate having a sound hole therein. The supports are disposed on two mutually opposing walls of the case and have external connection terminals. The diaphragm is housed in the insulating case. Two mutually opposing sides of the diaphragm are fixed to the supports with an adhesive or an elastic sealant, and the gaps between the other two sides of the diaphragm and the case are sealed with the elastic sealant. Also, the diaphragm and the terminals are electrically connected to each other with a conductive adhesive, and the cover plate is bonded to the upper surfaces of the sidewalls of the case.

Although the above-described electroacoustic transducer uses a unimorph piezoelectric diaphragm, a piezoelectric electroacoustic transducer using a piezoelectric diaphragm made of laminated piezoelectric ceramics is also disclosed in Japanese Patent Application Publication No. 2001-95094.

In the known piezoelectric electroacoustic transducers, two sides of the diaphragm are fixed to the case. In addition, the gaps between the case and the other two sides or all four sides of the diaphragm are sealed with an elastic sealant in order to separate the front and rear sides of the diaphragm so that two independent acoustic spaces are formed in the front and rear of the diaphragm. A soft elastic material such as a silicone rubber is used as the elastic sealant so as to minimize the vibration of the diaphragm.

FIGS. 12 and 13 are sectional views of sealing portions, using high-viscosity and low-viscosity elastic sealants, respectively, of the known piezoelectric electroacoustic transducers.

Any of the elastic sealants is filled in the gap between the side surface of the diaphragm and the inner surface of the case and is then cured. When a room-temperature-setting silicone rubber is used as an elastic sealant 42, as shown in FIG. 12, the gap between a diaphragm 40 and a case 41 is easily sealed since the elastic sealant 42 is quickly cured after being filled. However, the room-temperature-setting elastic sealant 42 causes an applicator to become easily clogged since the sealant 42 begins to be cured during its filling process, thereby leading to a poor workability. In addition, the sealant 42 has a high Young's modulus after being cured, thereby lessening the vibration of the diaphragm 40.

On the contrary, when a thermosetting silicone rubber having a low viscosity (i.e., a low thixotropy) is used as an elastic sealant 43, the elastic sealant 43 does not begin to be cured during its filling process and has a low Young's modulus, thereby providing an advantage in that the vibration of the diaphragm 40 is not reduced.

However, as shown in FIG. 13, the low-viscosity elastic sealant 43 flows to the bottom of the case 41, thereby causing a problem in that the gap between the diaphragm 40 and the case 41 is not sealed.

SUMMARY OF THE INVENTION

In order to overcome the problems described above, preferred embodiments of the present invention provide a piezoelectric electroacoustic transducer which reliably seals the gap between a diaphragm and a case and which provides excellent vibration characteristics of the diaphragm, even when the piezoelectric electroacoustic transducer uses a low-viscosity elastic sealant.

A piezoelectric electroacoustic transducer according to a preferred embodiment of the present invention includes two electrodes, a substantially square piezoelectric diaphragm producing a bending vibration in the thickness direction thereof in response to application of an alternating voltage between the two electrodes, a housing for housing the piezoelectric diaphragm, an elastic sealant for sealing the gap between the periphery of the diaphragm and the inner side surface of the housing, supports, disposed in the housing, for supporting at least two mutually opposing sides of the piezoelectric diaphragm or the four corners of the piezoelectric diaphragm, grooves which are disposed in the housing so as to face the periphery of the rear surface of the piezoelectric diaphragm and in which the elastic sealant is filled, and walls defining inner portions of the grooves, disposed such that the upper surfaces of the walls are located below those of the supports, for preventing the elastic sealant from flowing out to the bottom of the housing.

When a low-viscosity elastic sealant is used for filling the gap between the periphery of the diaphragm and the inner side surface of the housing, the elastic sealant tends to flow out through the gap between the diaphragm and the housing. However, in the piezoelectric electroacoustic transducer according to a preferred embodiment of the present invention, the elastic sealant flows into the grooves disposed in the housing, and, even when the elastic sealant is poured over the grooves, the walls defining inner portions of the grooves, for preventing the elastic sealant from flowing out, blocks the overflown elastic sealant so as to prevent the sealant from flowing out. Accordingly, the elastic sealant is prevented from flowing out to the bottom of the housing and thus remains in the gap between the periphery of the diaphragm and the inner side surface of the housing, thereby reliably sealing the gap therebetween.

Since the upper surfaces of the walls are located below those of the supports for supporting the diaphragm, the walls do not come to contact with the rear surface of the diaphragm and thus do not lessen or hinder the vibration of the diaphragm, consequently leading a piezoelectric electroacoustic transducer having excellent vibration characteristics.

In the piezoelectric electroacoustic transducer according to preferred embodiments of the present invention, gaps are preferably formed between the upper surfaces of the walls and the rear surface of the diaphragm so as to have a dimension such that the elastic sealant does not flow out through the gaps because of its surface tension. For example, when the viscosity of the uncured elastic sealant is about 1300 mPa·s, the foregoing dimension is preferably about 0.2 mm or less, since a dimension that is greater than the above figure may cause the elastic sealant to flow out to the bottom of the housing.

The piezoelectric electroacoustic transducer according to preferred embodiments of the present invention may further include a case having a substantially U-shape cross-section, a bottom, and side walls, a cover plate, and tapered projections, disposed on the inner surfaces of the side walls of the case, for guiding the periphery of the piezoelectric diaphragm, wherein the housing is defined by the cover plate being bonded to the upper surfaces of the sidewalls of the case.

The piezoelectric diaphragm produces a bending vibration in the thickness direction thereof in response to application of an alternating voltage between the two electrodes. When the periphery of the diaphragm comes into contact with the inner side surfaces of the side walls of the case at large areas, the vibration of the diaphragm is decreased and, as a result, its acoustic pressure decreases.

As a solution to this problem, the tapered protrusions which come into contact with the periphery of the diaphragm at small areas are disposed on the inner side surfaces of the sidewalls of the case so as to prevent the vibration of the diaphragm from being decreased or hindered. Also, since the protrusions have a function of guiding the diaphragm, the differences between the inner dimensions of the case and the outer dimensions of the diaphragm can be minimized, thereby achieving a small piezoelectric electroacoustic transducer.

The piezoelectric electroacoustic transducer according to preferred embodiments of the present invention may further include a case having a substantially U-shaped cross-section, a bottom, and side walls, a cover plate, and recesses, disposed along the upper inner edges of the sidewalls of the case, for preventing the elastic sealant from flowing upwardly, wherein the housing is defined by the cover plate being bonded to the upper surfaces of the sidewalls of the case.

When the elastic sealant flows up to the upper surfaces of the sidewalls while the cover plate is bonded to the upper surfaces of the sidewalls, the bonding strength of the cover plate decreases, as a result, sometimes causes air-leakage of an acoustic space formed in the upper portion of the diaphragm. As a solution to this problem, the recesses are formed along the upper inner edges of the sidewalls so as to prevent the elastic sealant from flowing upwardly, thereby allowing the cover plate to maintain its bonding strength.

As is clear from the above description, in the housing of the piezoelectric electroacoustic transducer according to preferred embodiments of the present invention, the grooves in which the elastic sealant is filled are formed and the walls for preventing the elastic sealant from flowing out are also formed as inner portions of the grooves. This configuration prevents the elastic sealant from flowing out to the bottom of the housing even when the elastic sealant has a low viscosity, and thus the elastic sealant reliable seals the gap between the periphery of the diaphragm and the inner side surface of the housing. As a result, both the manufacturing workability and the sealing performance of the piezoelectric electroacoustic transducer can be improved, and also the vibration characteristics of the same can be improved since the elastic sealant has a reduced Young's modulus after being cured.

Also, since the upper surfaces of the walls for preventing the elastic sealant are located below those of the supports for supporting the diaphragm, the walls do not come into contact with the rear surface of the diaphragm, thereby preventing the vibration of the diaphragm from being decreased or hindered.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
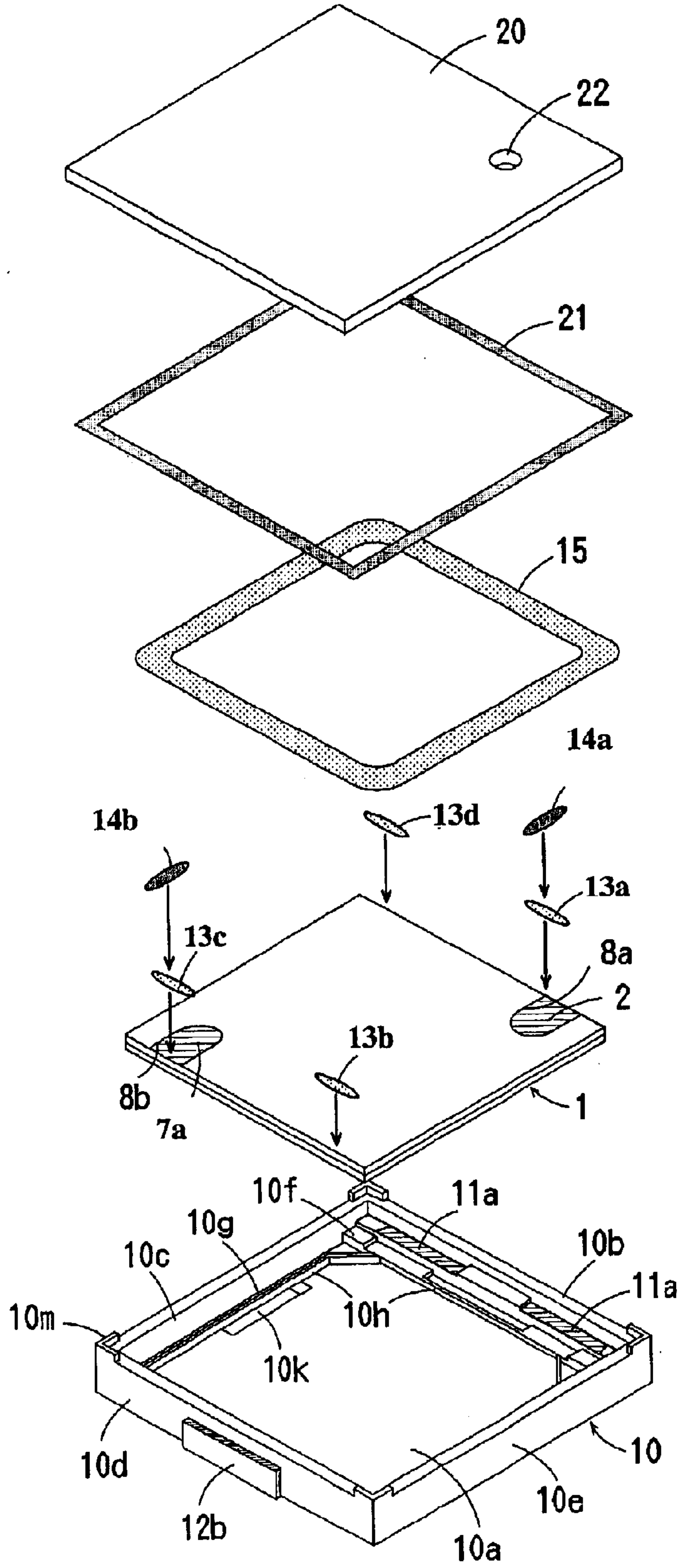
FIG. 1 is an exploded perspective view of a piezoelectric electroacoustic transducer according to a preferred embodiment of the present invention.

FIG. 1 shows an example surface-mounted piezoelectric electroacoustic transducer according to a preferred embodiment of the present invention.

The piezoelectric electroacoustic transducer according to a preferred embodiment is suitable for applications such as a piezoelectric receiver which responds to a wide range of frequencies, and has a piezoelectric diaphragm 1 having a laminated structure, a case 10, and a cover plate 20. The case 10 and the cover plate 20 define a housing.

Figure 2:
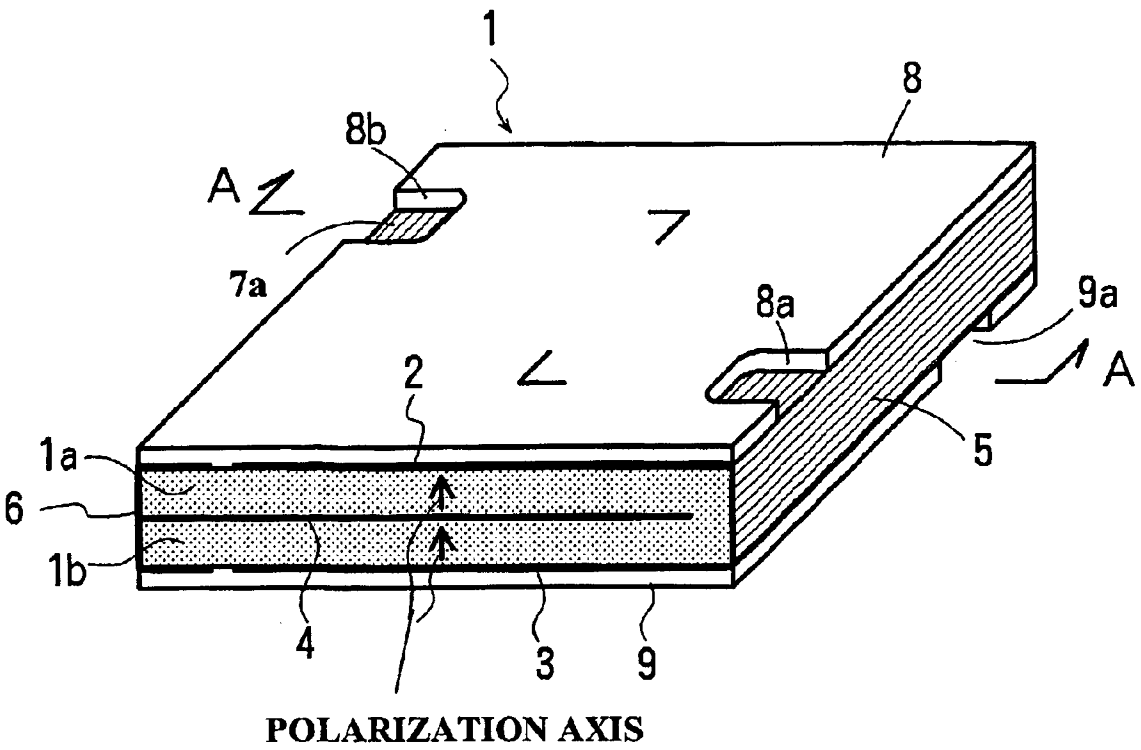
FIG. 2 is a perspective view of a piezoelectric diaphragm used for the piezoelectric electroacoustic transducer shown in FIG. 1.
Figure 3:
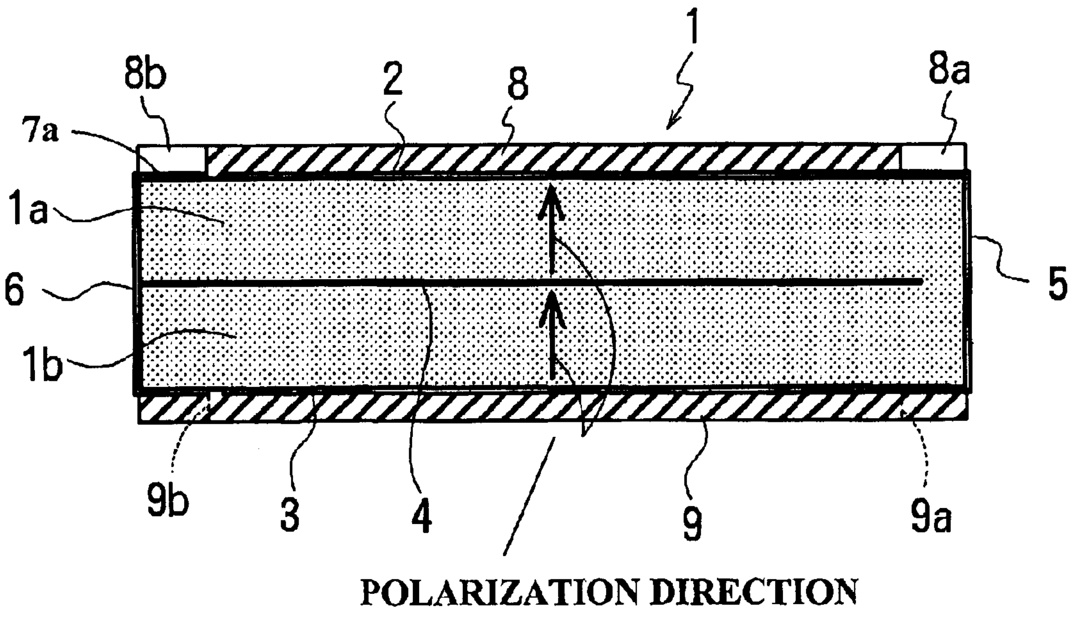
FIG. 3 is a stepped sectional view taken along the line A—A in FIG. 2.
Figure 4:
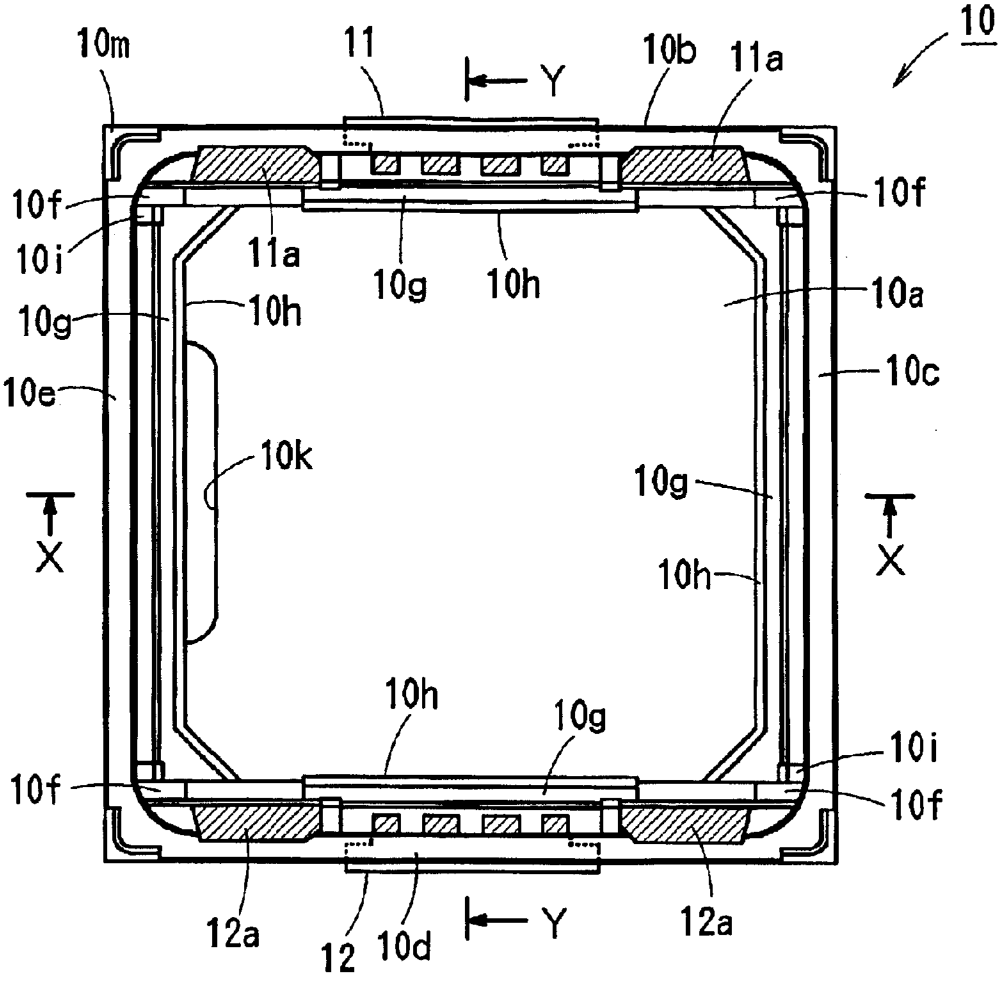
FIG. 4 is a plan view of a case used for the piezoelectric electroacoustic transducer shown in FIG. 1.
Figure 5:
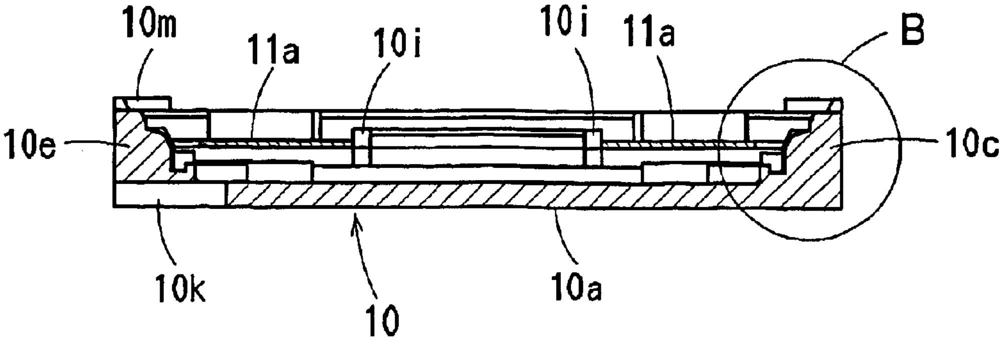
FIG. 5 is a sectional view of the case taken along the line X—X in FIG. 4.

As shown in FIGS. 2 and 3, the diaphragm 1 has two laminated piezoelectric ceramic layers 1*a* and 1*b*, major surface electrodes 2 and 3 disposed on the front and rear major surfaces thereof, respectively, and an internal electrode 4 disposed between the piezoelectric ceramic layers 1*a* and 1*b*. The two piezoelectric ceramic layers 1*a* and 1*b* are polarized in the same thickness direction as indicated by the bold arrows in the figures. Each of the major surface electrodes 2 and 3 on the front and rear surfaces, respectively, is preferably somewhat smaller than the diaphragm 1 in the lateral direction. Since one end of each major surface electrode is connected to a side surface electrode 5 disposed on a right side surface of the diaphragm 1, the major surface electrodes 2 and 3 are connected with each other. The internal electrode 4 has substantially the same shape as those of the major surface electrodes 2 and 3. One end of the internal electrode 4 is spaced away from the side surface electrode 5 and the other end thereof is connected to a side surface electrode 6 disposed on the left side surface in opposite to the right side surface of the diaphragm 1. The diaphragm 1 has front and rear auxiliary electrodes 7*a* and 7*b* which are respectively disposed on the front and rear surfaces thereof and close to the left side surface thereof and which are electrically connected to the side surface electrode 6.

The diaphragm 1 has resin layers 8 and 9, covering the major surface electrodes 2 and 3, on the front and rear surfaces thereof, respectively. The resin layers 8 and 9 define protection layers for preventing cracking of the diaphragm 1 caused by its dropping impact. The resin layers 8 and 9 on the front and rear surfaces have cuts 8*a* and 9*a*, from which the major surface electrodes 2 and 3 are exposed to the outside and which are disposed adjacent to the right side surface and near the two right corners of the diaphragm 1, respectively. In addition, the resin layers 8 and 9 have cuts 8*b* and 9*b*, from which the corresponding auxiliary electrodes 7*a* and 7*b* are exposed to the outside and which are formed adjacent to the left side surface and near the two left corners of the diaphragm 1, respectively.

All the cuts 8*a*, 8*b*, 9*a*, and 9*b* may be disposed on either the front surface or the rear surface. However, in the above example, these are disposed on the front and rear surfaces such that the front and rear surfaces of the diaphragm 1 are indistinguishable from each other.

The auxiliary electrodes 7*a* and 7*b* do not have to be strip electrodes having a fixed width. Instead, they may be disposed at locations on the front and rear surfaces so as to correspond to the cuts 8*b* and 9*b*.

In this preferred embodiment, the piezoelectric ceramic layers 1*a* and 1*b* are preferably made of a PZT ceramic having approximate dimensions of, for example, 10 $\mu$m×10 $\mu$m×40 $\mu$m, and the resin layers 8 and 9 are preferably made of a polyamide resin having a thickness of about 3 $\mu$m to about 10 $\mu$m.

Figure 6:
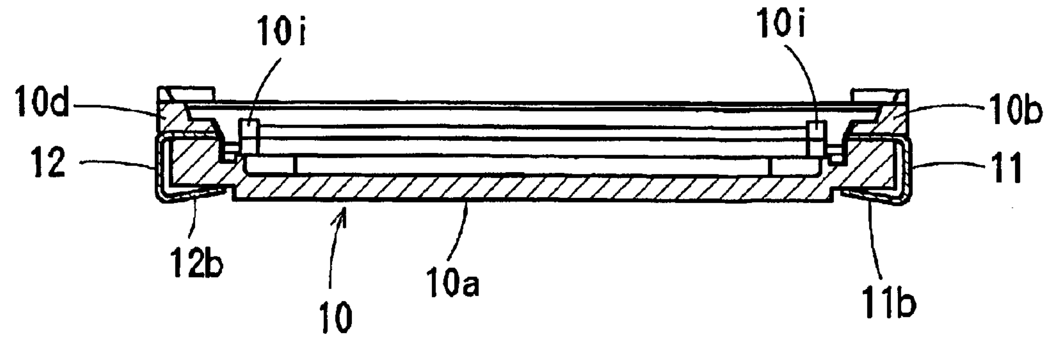
FIG. 6 is a sectional view of the case taken along the line Y—Y in FIG. 4.
Figure 7:
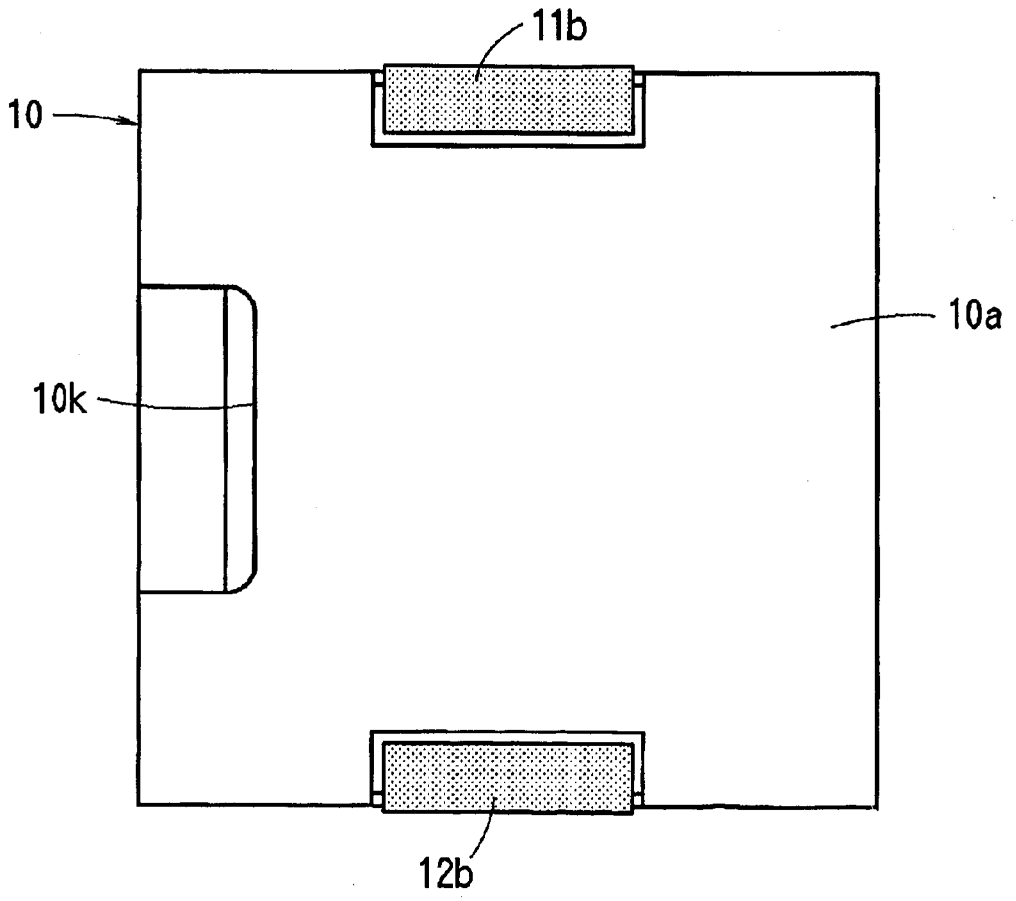
FIG. 7 is a bottom view of the case shown in FIG. 4.
Figure 8:
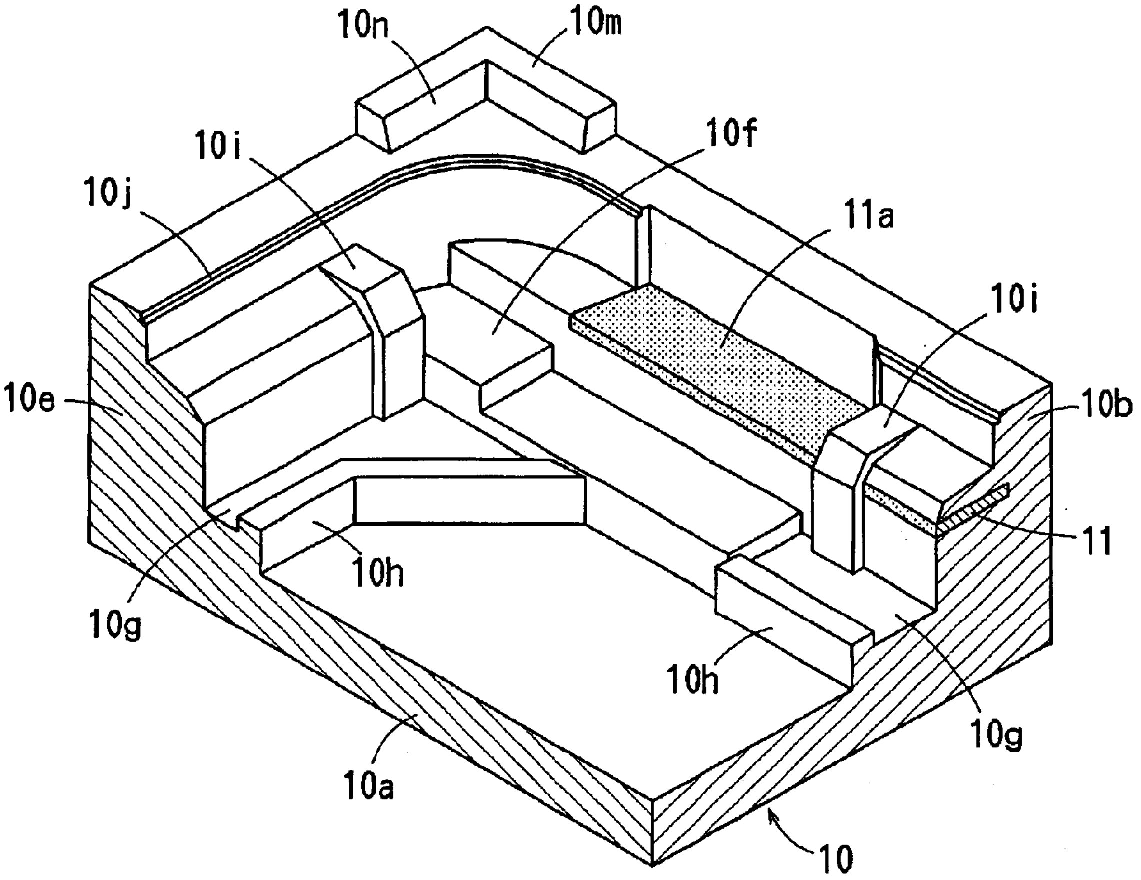
FIG. 8 is a magnified view of one of the corners of the case shown in FIG. 4.

Referring now to FIGS. 4 to 10, the structure of the case 10 will be described. The case 10 is preferably made of a resin material and has a cubic box shape in which a bottom 10*a* and four side walls 10*b* to 10*e* are provided. The preferable resin material is a heat-resistant resin including an LCP (liquid crystal polymer), an SPS (syndiotactic polystyrene), a PPS (polyphenylene sulfide), an epoxy, or other suitable material. Among the four wide walls 10*b* to 10*e*, the two mutually opposing side walls 10*b* and 10*d* have terminals 11 and 12, respectively, and the terminals 11 and 12 have two-way inner connectors 11*a* and 12*a* exposed to the inside of the side walls 10*b* and 10*d*, respectively. The terminals 11 and 12 have shapes shown in FIG. 11 and are preferably formed in the case 10 by insert molding. As shown in FIGS. 6 and 11, the terminals 11 and 12 have outer connectors 11*b* and 12*b* which are exposed to the outside of the case 10 and which are bent along from the side walls 10*b* and 10*d* to the bottom of the case 10, respectively.

The case 10 has four supports 10*f* therein, at the four corners thereof, for supporting the four corners of the diaphragm 1. The supports 10*f* are arranged so as to be lower by a step than the exposed portions of the inner connectors 11*a* and 12*a* of the terminals 11 and 12. With this configuration, when the diaphragm 1 is placed on the supports 10, the front surface of the diaphragm 1 is substantially flush with those of the inner connectors 11*a* and 12*a*.

The case 10 has four grooves 10*g*, which will be described later, disposed along the periphery of the bottom 10*a*, and in which an elastic sealant 15 is filled. Also, the case 10 has walls 10*h*, for preventing the elastic sealant 15 from flowing out to the bottom 10*a*, which define inner portions of the corresponding grooves 10*g* and which has upper surfaces located below those of the supports 10*f*. In this preferred embodiment, the bottom of each groove 10*g* is located above the upper surface of the bottom 10*a*, that is, the groove 10*g* has a shallow dent, so that the groove 10*g* is filled with a relatively small amount of the elastic sealant 15. The grooves 10 g and the walls 10*h* are disposed partially along the periphery of the bottom 10*a*, except for the portions of the bottom 10*a* on which elastic supporting agents 13*a* to 13*d* or adhesive agents 14*a* and 14*b*, which will be described later, are applied. Alternatively, they may be disposed along the entire periphery of the bottom 10*a*.

Also, the case 10 preferably has eight tapered projections 10*i*, two on the inner surface of each of the side walls 10*b* to 10*e*, for guiding the four sides of the diaphragm 1.

In addition, the case 10 has recesses 10*j*, along the upper inner edges of the side walls 10*b* to 10*e*, for preventing the elastic sealant 15 from flowing upwardly.

Furthermore, the case 10 preferably has a first sound output hole 10*k* formed near the side wall 10*e* and in the bottom 10*a*.

Moreover, the case 10 preferably has four protrusions 10*m* having a substantially L-shape, on the upper surfaces of the corners of the side walls 10*b* to 10*e*, for engaging with and supporting the corresponding corners of the cover 20. Each protrusion 10*m* preferably has a tapered surface 10*n* on the inner surface thereof for guiding the cover 20.

The diaphragm 1 is housed in the case 10 and is supported by the supports 10*f* at the corners thereof. Since the periphery of the diaphragm 1 is guided by the tapered protrusions 10*i* disposed on the inner surfaces of the side walls 10*b* to 10*e* when the diaphragm 1 is being housed in the case, the corners of the diaphragm 1 are accurately positioned and supported in a desired location on the supports 10*f*. In particular, since the clearance between the diaphragm 1 and the case 10 is smaller than the tolerance of inserting the diaphragm 1 by disposing the tapered protrusions 10*i*, the product size of the piezoelectric electroacoustic transducer can be reduced. Also, the small contact areas formed between the diaphragm 1 and the protrusions 10*i* prevent the vibration of the diaphragm 1 from being decreased.

Figure 10:
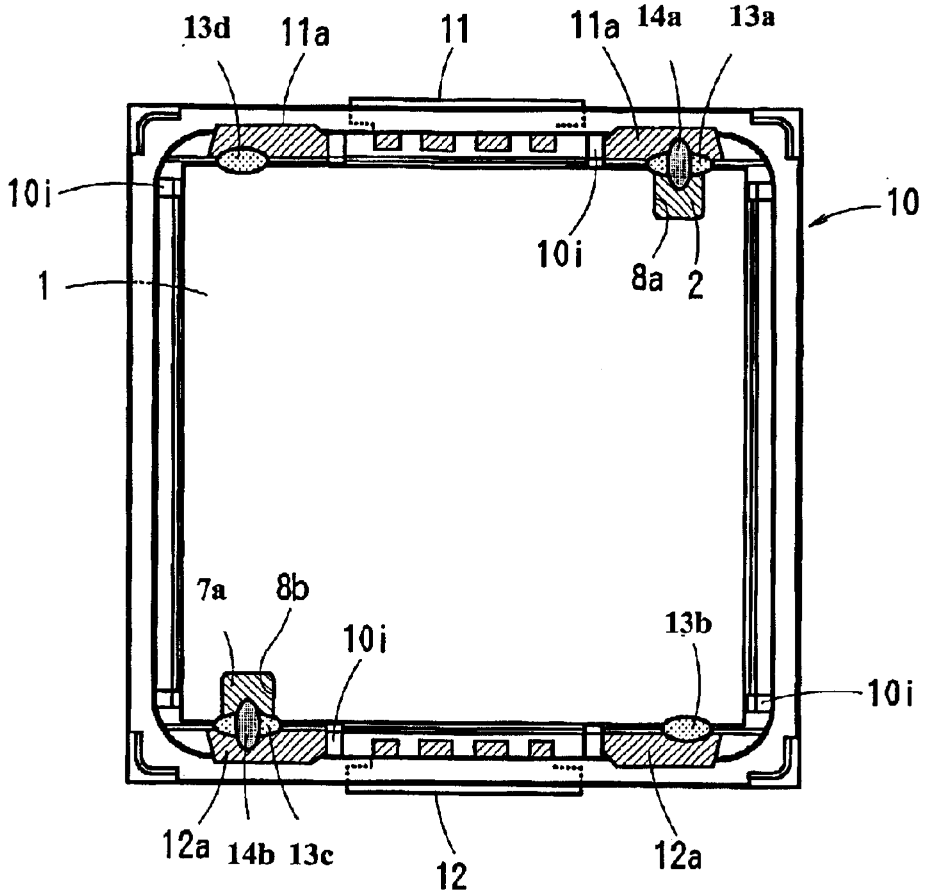
FIG. 10 is a plan view of the case shown in FIG. 4, wherein the case has the piezoelectric diaphragm housed therein.
Figure 11:
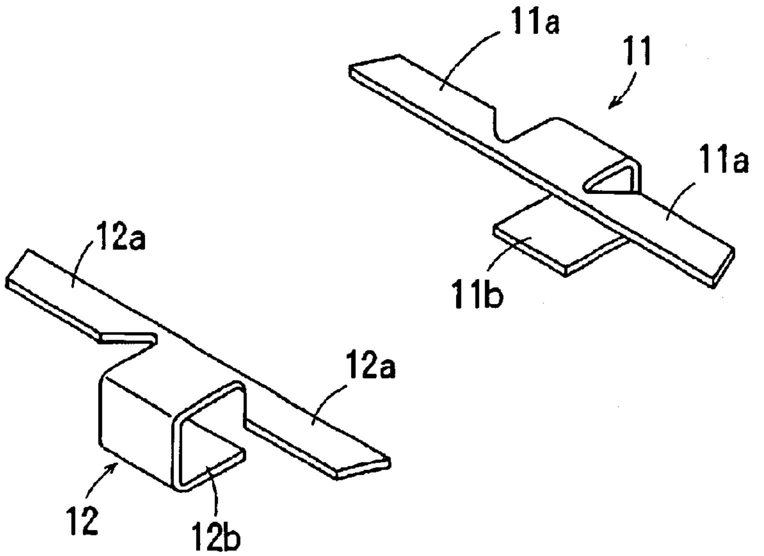
FIG. 11 is a perspective view of two terminals.
Figure 12:
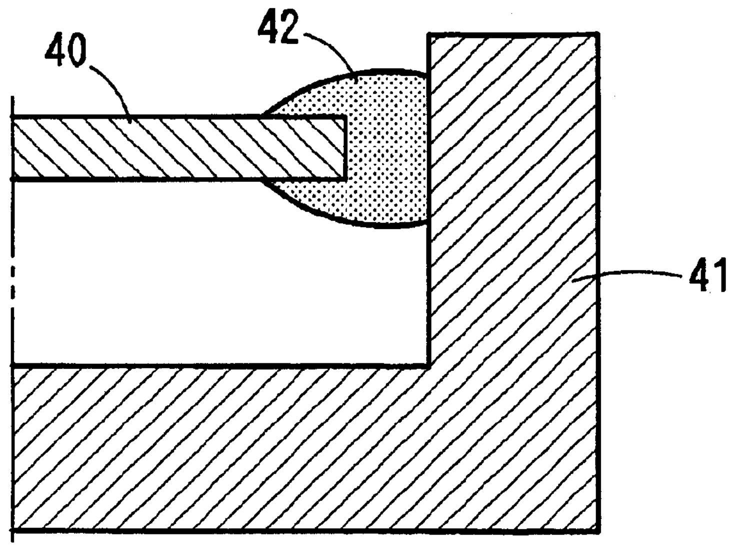
Fig. 12 PRIOR ART
FIG. 12 is a sectional view of a sealing portion, filled with a high-viscosity elastic sealant, of a known piezoelectric electroacoustic transducer.
Figure 13:
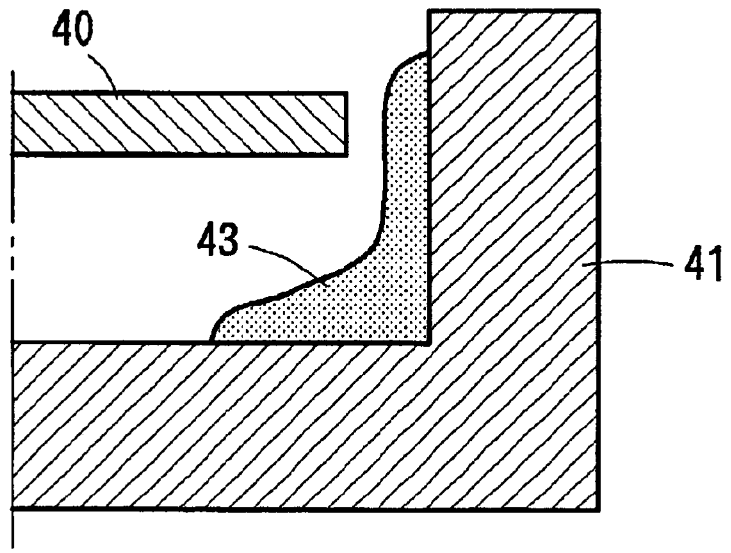
Fig. 13 PRIOR ART
FIG. 13 is a sectional view of a sealing portion, filled with a low-viscosity elastic sealant, of another known piezoelectric electroacoustic transducer.

After being housed in the case 10, the diaphragm 1 is fixed to the inner connections 11*a* and 12*a* of the terminals 11 and 12 by applying the elastic supporting agents 13*a* to 13*d* to four locations of the diaphragm 1 shown in FIG. 10. More particularly, the elastic supporting agent 13*a* is applied to the location between a portion of the major surface electrode 2, which is exposed to the cut 8*a*, and one of the inner connections 11*a* of the terminal 11, and the elastic supporting agent 13*c* is applied to the location between a portion of the upper auxiliary electrode 7*a*, which is exposed to the cut 8*b*, and one of the inner connections 12*a* of the terminal 12, wherein the cuts 8*a* and 8*b* are diagonally disposed with respect to the substantially square shape of the diaphragm 1. The elastic supporting materials 13*b* and 13*d* are also applied to the remaining two diagonally disposed locations. Although the elastic supporting agent is applied to each location so as to form an oblong ellipse or an oval in this preferred embodiment, the shape of the applied elastic supporting agent is not limited to these shapes. An example material of the preferable elastic supporting agents 13*a* to 13*d* is an adhesive having a low Young's modulus after being cured such as an urethane adhesive having a Young's modulus on the order of approximately $3.7\times10^6$ Pa. Preferably, the elastic supporting agents 13*a* to 13*d* have a high viscosity (e.g., about 50 dPa·s to about 120 dPa·s) in an uncured state and are unlikely to leak so as to prevent the elastic supporting agents 13*a* to 13*d* from flowing down through the gap between the diaphragm 1 and the case 10 when the elastic supporting agents 13*a* and 13*d* are applied. After being applied, the elastic supporting agents 13*a* to 13*d* are cured by heat.

As a method for fixing the diaphragm 1, the elastic supporting agents 13*a* to 13*d* may be applied with a dispenser or other suitable device after the diaphragm 1 is housed in the case 10, or alternatively, the diaphragm 1 may be housed in the case 10 after the elastic supporting agents 13*a* and 13*d* are applied to the diaphragm 1.

After the elastic supporting agents 13*a* to 13*d* are cured, conductive adhesive agents 14*a* and 14*b* are applied on the elastic supporting agents 13*a* and 13*c* so as to form an ellipse or a long narrow shape in a manner such that the conductive adhesive agents 14*a* and 14*b* intersect with the elastic supporting agents 13*a* and 13*c*, respectively. Thus, the major surface electrode 2 and one of the inner connectors 11*a* of the terminal 11 are connected, and also the upper auxiliary electrode 7*a* and one of the inner connectors 12*a* of the terminal 12 are connected. An example material of the conductive adhesive agents 14*a* and 14*b* is a conductive urethane paste having a Young's modulus of approximately $0.3\times10^9$ Pa after being cured. After being applied, the conductive adhesive agents 14*a* and 14*b* are cured by heat. A shape of each of the applied conductive adhesive agents 14*a* and 14*b* is not limited to an ellipse, and as long as the conductive adhesive agents 14*a* and 14*b* connect the major surface electrode 2 and the inner connector 11*a* as well as the upper auxiliary electrode 7*a* and the inner connector 12*a*, respectively, it is sufficient.

After the conductive adhesive agents 14*a* and 14*b* are applied and cured, the elastic sealant 15 is filled in the gap between the entire outer periphery of the diaphragm 1 and the inner periphery of the case 10 so as to prevent air-leakage between the spaces of the front and rear of the diaphragm 1. After being filled so as to form a loop, the elastic sealant 15 is cured by heat. An example material of the elastic sealant 15 is a thermosetting adhesive having a low Young's modulus (e.g., on the order of about $3.0\times10^5$ Pa) after being cured and also a low viscosity (e.g., about 1300 mPa·s) before being cured. A silicone adhesive is preferably used in this preferred embodiment.

Figure 9:
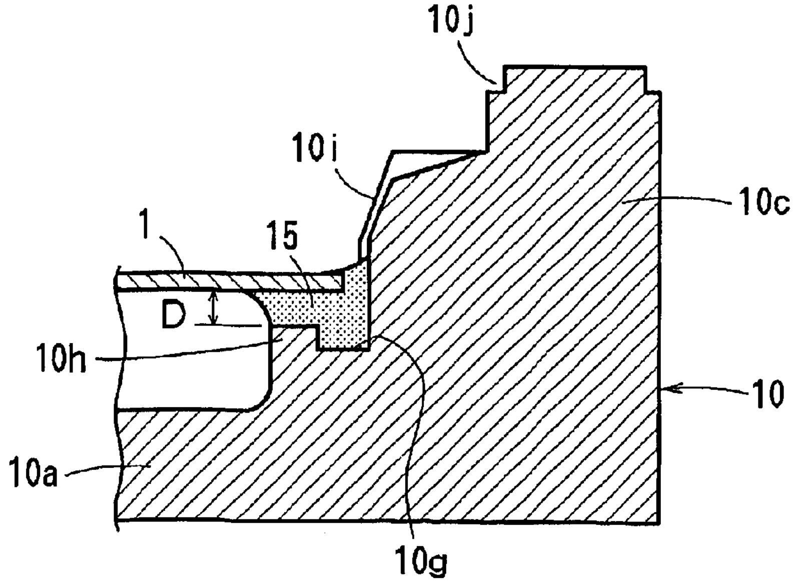
FIG. 9 is a magnified view of a portion B of the case indicated in FIG. 5, wherein the portion B is filled with an elastic sealant.

When the elastic sealant 15 is used for filling, there is a risk that the elastic sealant 15 flows down to the bottom 10*a* through the gap between piezoelectric diaphragm 1 and the case 10 because of its low viscosity. However, in this preferred embodiment, as shown in FIG. 9, the grooves 10*g* in which the elastic sealant 15 is filled are formed in the case 10 so as to face the periphery of the rear surface of the diaphragm 1, and the walls 10*h* for preventing the elastic sealant 15 from flowing out are formed as inner portions of the grooves 10 g, thereby allowing the elastic sealant 15 to remain in the grooves 10 and accordingly preventing it from flowing out to the bottom 10*a*. In particular, small gaps D are formed between the diaphragm 1 and the walls 10*h* since the upper surfaces of the walls 10*h* are located below those of the supports 10*f*. Since the gaps D are required to have a dimension such that the elastic sealant 15 is kept in the grooves 10*g* by its surface tension, the preferable dimension of the gaps D is about 0.2 mm or less when the elastic sealant 15 has a viscosity of about 1300 mPa·s. With this structure, even when the elastic sealant 15 is poured over the grooves 10*g*, the elastic sealant 15 is blocked by the gaps D and reliably prevented from flowing out to the bottom 10*a*. The purpose of the gaps D disposed between the diaphragm 1 and the walls 10*h* is to prevent the vibration of the diaphragm 1 from being decreased, since the vibration is lessened when the walls 10*h* come into contact with the diaphragm 1.

Also, a portion of the elastic sealant 15 may flow upwardly along the side walls 10*b* to 10*e* of the case 10 and adhere to the upper surfaces of the side walls 10*b* to 10*e*. When the elastic sealant 15 is a mold releasing sealant, the bonding strength of the cover plate 20 may decrease when the cover plate 20 is bonded to the upper surfaces of the side walls 10*b* to 10*e*. However, in this preferred embodiment, since the recesses 10*j* for preventing the elastic sealant 15 from flowing upwardly are disposed along the upper inner edges of the side walls 10*b* to 10*e*, the elastic sealant 15 is prevented from adhering to the upper surfaces of the side walls 10*b* to 11*e*.

After the diaphragm 1 is fixed to the case 10, the cover plate 20 is bonded to the upper surfaces of the side walls 10*b* to 10*e* of the case 10 with an adhesive 21. The cover plate 20 is preferably made of the same material as that of the case 10 so as to be flat. The periphery of the cover plate 20 engages with the tapered inner surfaces 10*n* of the positioning protrusions 10*m*, which are formed in a protruded manner on the upper surfaces of the side walls 10*b* to 10*e*, so that the cover plate 20 is accurately positioned. By bonding the plate 20 to the case 10, an acoustic space is between the cover plate 20 and the diaphragm 1. The cover plate 20 has a second sound hole 22. As described above, the surface-mounted piezoelectric electroacoustic transducer according to preferred embodiments of the present invention is completed.

In the piezoelectric electroacoustic transducer according to preferred embodiments, the diaphragm 1 produces a bending vibration in a surface bending mode in response to application of a predetermined alternating voltage between the terminals 11 and 12. Since one of the piezoelectric ceramic layers whose directions of polarization and electric field are the same with each other contracts a-long the surface thereof and the other piezoelectric ceramic layer whose directions of polarization and electric field are opposite to each other expands along the surface thereof, the diaphragm 1 as a whole bends in the thickness direction thereof.

In this preferred embodiment, the diaphragm 1 preferably includes a ceramic laminate, and two vibration regions (i.e., the two ceramic layers) disposed adjacent to each other in the laminate vibrate in mutually reverse directions, thereby achieving a larger displacement, that is, a larger acoustic pressure than the unimorph diaphragm.

The present invention is not limited to the above-described preferred embodiments, and various modifications of the preferred embodiments can be made without departing from the spirit of the present invention.

In the foregoing preferred embodiments, the supports 10*f* are preferably disposed at the four corners of the case 10 so as to support the four corners of the diaphragm 1 thereon. Alternatively, two stepped supports may be provided on the two mutually facing side walls of the case 10 so as to support the corresponding two mutually opposing sides of the diaphragm 1 thereon.

The filling region of the elastic sealant is not limited to the entire periphery of the diaphragm 1 as in the preferred embodiments described above. When two mutually opposing sides of the diaphragm 1 are continuously fixed to the above-described stepped supports of the case 10 with an elastic supporting agent, the elastic sealant may be filled in the gap between the remaining two sides of the diaphragm 1 and the case 10.

In the above-described preferred embodiments, although the diaphragm 1 preferably has two laminated piezoelectric ceramic layers, the diaphragm 1 may have three or more laminated piezoelectric ceramic layers.

The piezoelectric diaphragm 1 is not limited to a laminate defined by a plurality of piezoelectric ceramic layers. Instead, a known unimorph or bimorph diaphragm, in which a metal plate has a piezoelectric sheet bonded on one side thereof or two piezoelectric sheets bonded on both sides thereof, respectively, may be used.

The housing of the present invention is not limited to the structure in which the cover plate 20 is bonded to the upper surfaces of the side walls of the case 10 having a substantially U-shape cross-section according to the preferred embodiments. In place of this structure, the housing may be formed by a case having an inverted U-shape cross-section which is downwardly open and a circuit board which is bonded to the lower surfaces of the side walls of the case. In this case, the circuit board needs to have an electrode pattern previously formed thereon for providing terminals.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric electroacoustic transducer comprising:

at least two electrodes;

a substantially square piezoelectric diaphragm adapted to produce a bending vibration in a thickness direction thereof in response to application of an alternating voltage between the at least two electrodes;

a housing for housing the piezoelectric diaphragm;

an elastic sealant for sealing a gap between a periphery of the diaphragm and an inner side surface of the housing;

supports, disposed in the housing, for supporting at least two mutually opposing sides of the piezoelectric diaphragm or four corners of the piezoelectric diaphragm;

grooves which are disposed in the housing so as to face a periphery of the rear surface of the piezoelectric diaphragm and in which the elastic sealant is filled; and walls defining inner portions of the grooves, disposed such that the upper surfaces of the walls are located below those of the supports, for preventing the elastic sealant from flowing out to the bottom of the housing.

2. The piezoelectric electroacoustic transducer according to claim 1, wherein gaps are formed between the upper surfaces of the walls and the rear surface of the diaphragm so as to have a dimension such that the elastic sealant does not flow out through the gaps because of its surface tension.

3. The piezoelectric electroacoustic transducer according to claim 1, further comprising:

a case having a substantially U-shape cross-section, a bottom, and side walls;

a cover plate; and tapered projections, disposed on the inner surfaces of the side walls of the case, for guiding a periphery of the piezoelectric diaphragm;

wherein the housing is defined by the cover plate being bonded to the upper surfaces of the sidewalls of the case.

4. The piezoelectric electroacoustic transducer according to claim 1, further comprising:

a case including a U-shape cross-section, a bottom, and side walls;

a cover plate; and recesses, disposed along the upper inner edges of the sidewalls of the case, for preventing the elastic sealant from flowing upwardly;

wherein the housing is defined by the cover plate being bonded to the upper surfaces of the sidewalls of the case.

5. The piezoelectric electroacoustic transducer according to claim 1, wherein the diaphragm includes at least two piezoelectric ceramic layers and major surface electrodes disposed thereon.

6. The piezoelectric electroacoustic transducer according to claim 5, wherein the at least two piezoelectric ceramic layers are polarized in a common thickness direction thereof.

7. The piezoelectric electroacoustic transducer according to claim 5, further comprising resin layers arranged to cover the at least two piezoelectric ceramic layers.

8. The piezoelectric electroacoustic transducer according to claim 7, wherein the resin layers have cuts formed therein.

9. The piezoelectric electroacoustic transducer according to claim 3, wherein the case has a plurality of grooves disposed along the periphery of the bottom of the case and in which an elastic sealant is filled.

10. The piezoelectric electroacoustic transducer according to claim 4, wherein the case has a plurality of grooves disposed along the periphery of the bottom of the case and in which an elastic sealant is filled.

11. The piezoelectric electroacoustic transducer according to claim 3, wherein the case has at least one sound output hole formed therein.

12. The piezoelectric electroacoustic transducer according to claim 4, wherein the case has at least one sound output hole formed therein.

13. The piezoelectric electroacoustic transducer according to claim 3, wherein the tapered projections are substantially L-shaped and disposed on the upper surfaces of the corners of the side walls.

14. The piezoelectric electroacoustic transducer according to claim 4, wherein the tapered projections are substantially L-shaped and disposed on the upper surfaces of the corners of the side walls.

15. The piezoelectric electroacoustic transducer according to claim 1, further comprising a case having four walls and four corners, wherein the supports are disposed at four corners of the case so as to support the four corners of the diaphragm thereon.

16. The piezoelectric electroacoustic transducer according to claim 1, wherein the elastic sealant is a thermosetting adhesive.

17. The piezoelectric electroacoustic transducer according to claim 16, wherein the elastic sealant has a Young's modulus of about $3.0\times10^5$ Pa.

* * * * *